United States Patent
Stephens, IV (10) Patent No.: US 7,724,791 B2
(45) Date of Patent: May 25, 2010

(54) METHOD OF MANUFACTURING LASER DIODE PACKAGES AND ARRAYS

(75) Inventor: Edward F. Stephens, IV, Golden Eagle, IL (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 84 days.

(21) Appl. No.: 12/009,458

(22) Filed: Jan. 18, 2008

(65) Prior Publication Data

US 2009/0185593 A1    Jul. 23, 2009

(51) Int. Cl.
    *H01S 3/04* (2006.01)
(52) U.S. Cl. .................... 372/36; 438/121; 438/122; 228/123.1; 228/124.5
(58) Field of Classification Search ............. 372/34–36; 228/121–124.5, 198; 438/106–127
See application file for complete search history.

(56) References Cited

U.S. PATENT DOCUMENTS

| | | | |
|---|---|---|---|
| 3,303,432 A | 2/1967 | Garfinkel et al. | |
| 3,339,151 A | 8/1967 | Smith | |
| 3,590,248 A | 6/1971 | Chatterton, Jr. | |
| 3,654,497 A | 4/1972 | Dyment et al. | |
| 3,683,296 A | 8/1972 | Scalise | |
| 3,771,031 A | 11/1973 | Kay | |
| 3,802,967 A | 4/1974 | Ladany et al. | |
| 3,896,473 A | 7/1975 | DiLorenzo et al. | |
| 3,958,263 A | 5/1976 | Panish et al. | |
| 3,962,655 A | 6/1976 | Selway et al. | |
| 4,057,101 A | 11/1977 | Ruka et al. | |
| 4,092,614 A | 5/1978 | Sakuma et al. | |
| 4,219,072 A | 8/1980 | Barlow | |
| 4,228,406 A | 10/1980 | Lewis et al. | |
| 4,233,567 A | 11/1980 | Chernoch | |
| 4,315,225 A | 2/1982 | Allen, Jr. et al. | |
| 4,383,270 A | 5/1983 | Schelhorn | |
| 4,393,393 A | 7/1983 | Allen, Jr. et al. | |
| 4,415,234 A | 11/1983 | Myers | |
| 4,454,602 A | 6/1984 | Smith | |
| 4,573,067 A | 2/1986 | Tuckerman et al. | |

(Continued)

OTHER PUBLICATIONS

A.B. Mann et al., "Modeling and Characterizing the Propagation Velocity of Exothermic Reactions in Multilayer Foils," J. Appl. Phys., vol. 82, No. 3, pp. 1178-1188, Aug. 1, 1997 (11 pages).

(Continued)

*Primary Examiner*—Minsun Harvey
*Assistant Examiner*—Xnning Niu
(74) *Attorney, Agent, or Firm*—Nixon Peabody LLP (57) ABSTRACT

A laser diode package according to the present invention is composed of CTE mismatched components soldered together. The laser diode package includes a laser diode bar, at least one heat sink, and at least one exothermic layer. Solder layers are adjacent the heat sink(s) and laser diode bar, respectively. The exothermic layer(s) are positioned between the solder layers. The exothermic layer(s) are exposed to an energy source which causes an exothermic reaction to propagate through the exothermic layer thereby melting the solder layers and solder layers. The exothermic layer(s) may be designed to provide sufficient heat to melt the solder layers and solder layers but provide only minimal heat to the laser diode bar and heat sink(s). Several packages can be stacked together to form a laser diode array.

20 Claims, 5 Drawing Sheets

U.S. PATENT DOCUMENTS

| | | |
|---|---|---|
| 4,617,585 A | 10/1986 | Yasui et al. |
| 4,673,030 A | 6/1987 | Basiulis |
| 4,709,750 A | 12/1987 | White |
| 4,716,568 A | 12/1987 | Scifres et al. |
| 4,730,324 A | 3/1988 | Azad |
| 4,782,222 A | 11/1988 | Ragle et al. |
| 4,831,629 A | 5/1989 | Paoli et al. |
| 4,837,768 A | 6/1989 | Schmid et al. |
| 4,847,848 A | 7/1989 | Inoue et al. |
| 4,852,109 A | 7/1989 | Kuchar |
| 4,877,641 A | 10/1989 | Dory |
| 4,881,233 A | 11/1989 | von Arb et al. |
| 4,881,237 A | 11/1989 | Donnelly |
| 4,899,204 A | 2/1990 | Rosen et al. |
| 4,901,330 A | 2/1990 | Wolfram et al. |
| 4,949,346 A | 8/1990 | Kuper et al. |
| 4,963,741 A | 10/1990 | McMullin |
| 4,975,923 A | 12/1990 | Buus et al. |
| 5,001,355 A | 3/1991 | Rosen et al. |
| 5,005,640 A | 4/1991 | Lapinski et al. |
| 5,022,042 A | 6/1991 | Bradley |
| 5,031,187 A | 7/1991 | Orenstein et al. |
| 5,040,187 A | 8/1991 | Karpinski |
| 5,073,838 A | 12/1991 | Ames |
| 5,076,348 A | 12/1991 | Bluege |
| 5,084,888 A | 1/1992 | Tajima et al. |
| 5,099,214 A | 3/1992 | Rosen et al. |
| 5,099,488 A | 3/1992 | Ahrabi et al. |
| 5,105,429 A | 4/1992 | Mundinger et al. |
| 5,115,445 A | 5/1992 | Mooradian |
| 5,128,951 A | 7/1992 | Karpinski |
| 5,156,999 A | 10/1992 | Lee |
| 5,163,064 A | 11/1992 | Kim et al. |
| 5,212,699 A | 5/1993 | Masuko et al. |
| 5,216,263 A | 6/1993 | Paoli |
| 5,216,688 A | 6/1993 | Kortz et al. |
| 5,220,954 A | 6/1993 | Longardner et al. |
| 5,253,260 A | 10/1993 | Palombo |
| 5,265,113 A | 11/1993 | Halldorsson et al. |
| 5,284,790 A | 2/1994 | Karpinski |
| 5,287,375 A | 2/1994 | Fujimoto et al. |
| 5,305,344 A | 4/1994 | Patel |
| 5,311,535 A | 5/1994 | Karpinski |
| 5,311,536 A | 5/1994 | Paoli et al. |
| 5,315,154 A | 5/1994 | Elwell |
| 5,323,411 A | 6/1994 | Shirasaka et al. |
| 5,325,384 A | 6/1994 | Herb et al. |
| 5,337,325 A | 8/1994 | Hwang |
| 5,351,259 A | 9/1994 | Ishimori et al. |
| 5,381,944 A | 1/1995 | Makowiecki et al. |
| 5,388,755 A | 2/1995 | Baxter |
| 5,394,426 A | 2/1995 | Joslin |
| 5,394,427 A | 2/1995 | McMinn et al. |
| 5,402,436 A | 3/1995 | Paoli |
| 5,402,437 A | 3/1995 | Mooradian |
| 5,438,580 A | 8/1995 | Patel et al. |
| 5,485,482 A | 1/1996 | Selker et al. |
| 5,520,244 A | 5/1996 | Mundinger et al. |
| 5,526,373 A | 6/1996 | Karpinski |
| 5,538,795 A | 7/1996 | Barbee, Jr. et al. |
| 5,547,715 A | 8/1996 | Barbee, Jr. et al. |
| 5,663,979 A | 9/1997 | Marshall |
| 5,734,672 A | 3/1998 | McMinn et al. |
| 5,764,675 A | 6/1998 | Juhala |
| 5,834,840 A | 11/1998 | Robbins et al. |
| 5,835,518 A | 11/1998 | Mundinger et al. |
| 5,898,211 A | 4/1999 | Marshall et al. |
| 5,913,108 A | 6/1999 | Stephens et al. |
| 5,985,684 A | 11/1999 | Marshall et al. |
| 5,987,043 A | 11/1999 | Brown et al. |
| 6,056,188 A | 5/2000 | Azdasht et al. |
| 6,307,871 B1 | 10/2001 | Heberle |
| 6,310,900 B1 | 10/2001 | Stephens et al. |
| 6,351,478 B1 | 2/2002 | Heberle |
| 6,352,873 B1 | 3/2002 | Hoden |
| 6,365,973 B1 | 4/2002 | Koning |
| 6,397,618 B1 | 6/2002 | Chu et al. |
| 6,570,895 B2 | 5/2003 | Heberle |
| 6,636,538 B1 | 10/2003 | Stephens |
| 6,919,525 B2 | 7/2005 | Pinneo |
| 2002/0018498 A1 | 2/2002 | Heberle |
| 2005/0051891 A1 | 3/2005 | Yoshida et al. |
| 2006/0045154 A1 | 3/2006 | Linares |
| 2006/0203866 A1 | 9/2006 | Stephens, IV |

OTHER PUBLICATIONS

D. Van Heerden et al., "Thermal Behavior of a Soldered Cu-Si Interface," 20th IEEE Semi-Therm Symposium, pp. 46-49, 2004 (4 pp.).

J. Wang et al., "Room-Temperature Soldering With Nanostructure Foils," Applied Physics Letters, vol. 83, No. 19, pp. 3987-3989, Nov. 10, 2003 (3 pages).

METHOD OF MANUFACTURING LASER DIODE PACKAGES AND ARRAYS

FIELD OF THE INVENTION

The present invention relates generally to laser diodes and, in particular, to attaching laser diodes to heat sinks.

BACKGROUND OF THE INVENTION

Semiconductor laser diodes have numerous advantages. They are small in that the width of their active regions is typically submicron to a few microns and their height is usually no more than a fraction of a millimeter. The length of their active regions is typically less than about a millimeter. The internal reflective surfaces, which produce emission in one direction, are formed by cleaving the substrate from which the laser diodes are produced and, thus, have high mechanical stability. The laser diode typically has several emitters, each of which is aligned with a corresponding active region.

High efficiencies are possible with semiconductor laser diodes with some pulsed junction laser diodes having external quantum efficiencies near 65%. Semiconductor lasers produce radiation at wavelengths from about 20 to about 0.7 microns depending on the semiconductor alloy that is used. For example, laser diodes made of gallium arsenide with aluminum doping (AlGaAs) emit radiation at approximately 0.8 microns (~800 nm) which is near the absorption spectrum of common solid-state laser rods and slabs made from Neodymium doped, Yttrium-Aluminum Garnet (Nd:YAG), and other crystals and glasses. Thus, semiconductor laser diodes can be used as the optical pumping source for larger, solid-state laser systems.

Universal utilization of semiconductor laser diodes has been restricted by thermal related problems that can cause catastrophic failures. These problems are associated with the large heat dissipation per unit area of the laser diodes which results in elevated temperatures within the active regions and stresses induced by thermal cycling. Laser diode efficiency and the service life of the laser diode is decreased as the operating temperature in the active region increases. Thus, high powered laser diodes require significant heat sinking.

Solder is often used to make electrical and thermal connection between laser diodes and heat sinks. Conventionally, soldering is performed by applying a solder layer between the laser diode and heat sink(s), then externally heating the laser diode and heat sink(s) to the melting temperature of the solder. However, problems arise because laser diodes and heat sinks are typically made from different materials having different coefficients of thermal expansion (CTE). The CTE is a measurement of the expansion and contraction of each material during heating and cooling cycles, respectively. Attachment of CTE mismatched devices can cause degraded performance and reduced service life of the devices due to warpage or fracturing during the heating and cooling cycles of conventional soldering. Because heat sinks are typically metallic and laser diodes are generally non-metallic materials, CTE mismatching is particularly problematic.

To minimize CTE mismatching problems associated with conventional soldering methods, a choice is often made between using either a soft solder on a high thermally conductive heat sink or hard solder on a low thermally conductive heat sink. However, using the hard solder on a low thermally conductive heat sink causes higher temperature operation of the laser diode, which can reduce the service life of the laser diode. Using the soft solder on a high thermally conductive heat sink can lead to electrical and thermal migration of the solder under certain operating conditions, which also can reduce the service life of the laser diode. Thus, in addition to thermal problems related to operation, there are potential thermal problems related to the assembly of the laser diodes.

Therefore, a need exists for a way to solder CTE mismatched high thermally conductive heat sinks to laser diodes with hard solder.

SUMMARY OF THE INVENTION

The present invention minimizes problems associated with soldering CTE mismatched components by providing a novel laser diode package. The laser diode package includes a laser diode bar, a bar solder layer for attachment to the laser diode bar, at least one heat sink, a heat-sinking solder layer for attachment to the heat sink(s), and at least one exothermic layer located between the bar solder layer(s) and the heat-sinking solder layer(s). The laser diode bar is joined to the heat sink(s) when the exothermic layer is exposed to a known energy source which causes an exothermic reaction to propagate through the exothermic layer thereby melting at least a portion of the bar and heat-sinking solder layers, which subsequently solidify. Accordingly, unlike prior art methods that apply energy to the exterior of a laser diode package, the present invention applies energy from the interior of a laser diode package to melt the solder layers of the laser diode package. The exothermic layer may be designed by size or material type such that minimal heat is transferred to the laser diode bar or heat sink(s). Thus, CTE mismatching problems can be minimized because the laser diode bars and heat sinks do not significantly expand or contract during assembly.

The present invention also minimizes problems associated with soldering CTE mismatched components by providing a novel method for manufacturing a laser diode package. The laser diode package to be manufactured includes a laser diode bar having a bar solder layer and a first heat-sinking structure having a heat-sinking solder layer. The method of manufacture includes positioning a first exothermic layer between the heat-sinking solder layer and the bar solder layer and exposing the first exothermic layer to a known energy source to cause liquidification of at least a portion of the heat-sinking solder layer and the bar solder layer. The laser diode bar manufacturing method may be completed by allowing the heat-sinking solder layer and the bar solder layer to solidify to join the first heat-sinking structure to the laser diode bar.

The present invention additionally provides a novel method for manufacturing an array of laser diode packages. Each laser diode package includes a laser diode bar, at least one heat-sinking structure, and exterior solder layers. An exothermic layer is positioned between the exterior solder layers of adjacent laser diode packages. When the exothermic layers are exposed to a known energy source, an exothermic reaction propagates through the exothermic layer(s) thereby causing the exterior solder layers to melt and join adjacent laser diode packages. Numerous individual packages can be assembled in such a fashion, resulting in a multi-bar laser diode array.

The above summary of the present invention is not intended to represent each embodiment, or every aspect, of the present invention. This is the purpose of the Figures and the detailed description which follow.

BRIEF DESCRIPTION OF THE DRAWINGS

The foregoing and other advantages of the invention will become apparent upon reading the following detailed description and upon reference to the drawings.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DESCRIPTION OF ILLUSTRATIVE EMBODIMENTS

Figure 1A:
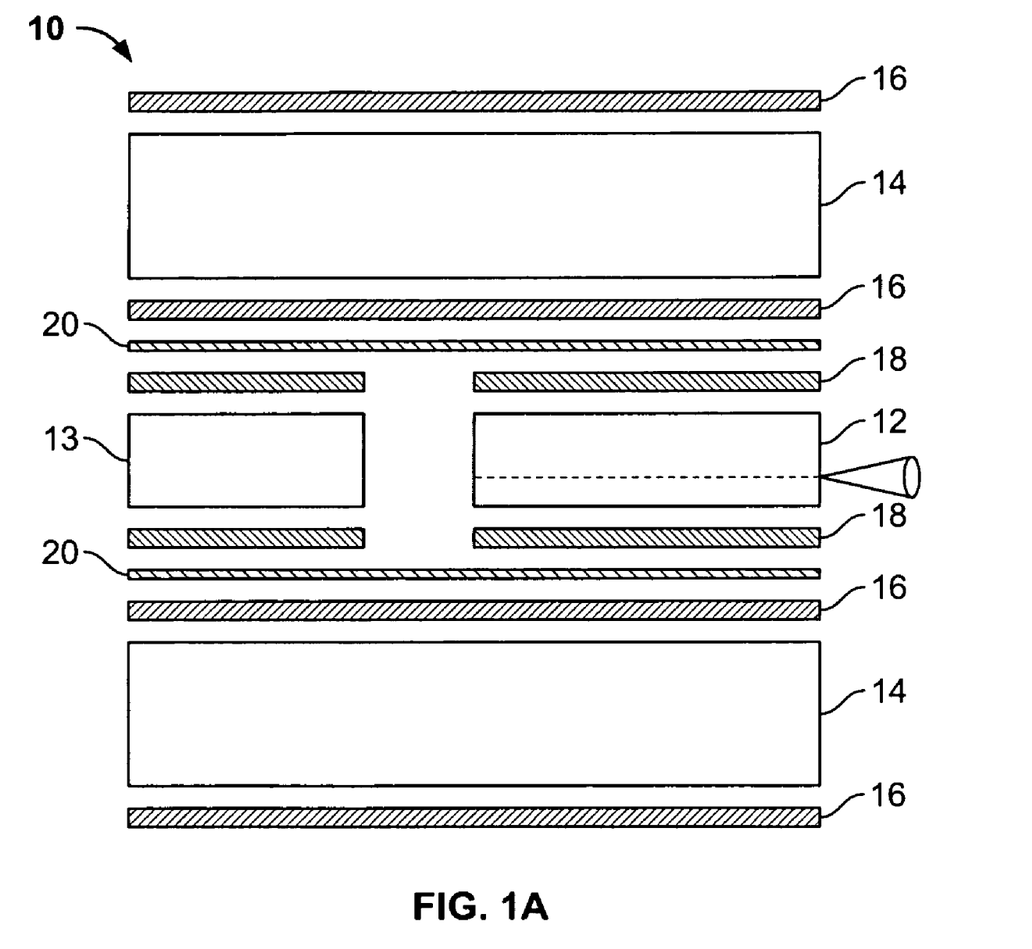
FIG. 1A illustrates an exploded side view of a laser diode package prior to soldering the laser diode bar to the heat sink(s).

FIG. 1A illustrates the unassembled components of a laser diode package 10 prior to soldering. According to one illustrative embodiment, the laser diode package 10 includes a laser diode bar 12 and two heat sinks 14. The laser diode bar 12 is positioned between each of the heat sinks 14. Optionally, a spacer 13 may be positioned between the heat sinks 14 adjacent to the laser diode bar 12 to reduce stress on the laser diode bar 12 during assembly. While two heat sinks 14 are illustrated, it is contemplated that a laser diode package 10 may include only one heat sink 14, for example, as in embodiments described below with respect to FIGS. 5A and 5B.

The solder layers 16 are adjacent to a plurality of surfaces of the heat sinks 14. Similarly, the solder layers 18 are adjacent to a plurality of surfaces of the laser diode bar 12. It is contemplated that each solder layer 16 and/or solder layer 18 may be a continuous layer of solder or may have minor discontinuities. If a spacer 13 is included, the solder layer 18 may extend such that it is also adjacent to a plurality of surfaces of the spacer 13. Alternatively, the solder layers 18 may be interrupted between the laser diode bar 12 and the spacer 13, as shown in FIG. 1A. An exothermic layer 20 is positioned between the solder layers 16 and the solder layers 18.

Figure 1B:
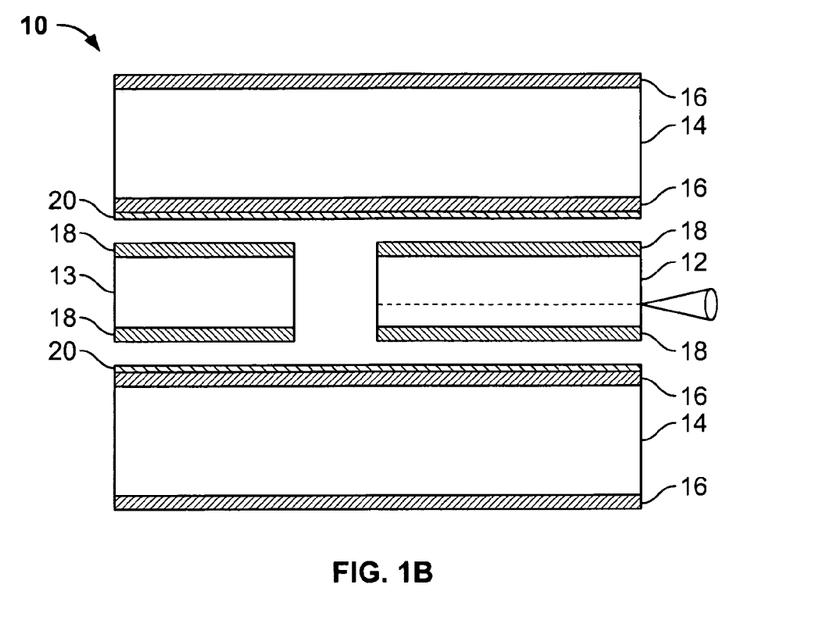
FIG. 1B illustrates a partially exploded side view of a laser diode package with solder layers and exothermic layers applied to heat sink(s) and laser diode bar prior to soldering the laser diode bar to the heat sink(s).

FIG. 1B illustrates the components of a laser diode package 10 partially assembled prior to soldering the laser diode bar 12 to the heat sinks 14. According to one embodiment, the solder layers 16 and the solder layers 18 may be applied to the heat sinks 14 and the laser diode bar 12, respectively. The exothermic layers 20 may be directly deposited on either the solder layers 16, as shown in FIG. 1B, or the solder layers 18 (not shown) by methods including, but not limited to, sputtering, plating, thermal evaporation, vacuum arc deposition, or e-beam evaporation. For laser diode packages 10 including two heat sinks 14, it is contemplated that the first exothermic layer 20 (located between the first heat sink and the laser diode bar) may be deposited on the solder layer 16 and the second exothermic layer 20 (located between the second heat sink and the laser diode bar) may be deposited on the solder layer 18. Alternatively, the exothermic layers 20 may be manufactured as a separate foil of exothermic material, which can be precisely positioned between the solder layers 16 and the solder layers 18. Non-limiting examples of suitable a foil-type exothermic layer 20 are manufactured by Reactive Nanotechnologies, Inc. located at 111 Lake Front Drive, Hunt Valley, Md. 21030 (otherwise available at www.rntfoil.com).

While the solder layers 16 and the solder layers 18 may be separate foil-like components, the heat sinks 14 and/or the laser diode bar 12 of the laser diode package 10 are preferably manufactured in such a way so as to have the material for the solder layers 16 and/or the solder layers 18, respectively, applied on their exterior surfaces (i.e., "pretinned"). Such structures are described in U.S. Pat. No. 6,636,538 entitled "Laser Diode Packaging" which was filed on Mar. 29, 1999, and is incorporated herein by reference in its entirety. By pretinning the entire heat sink 14 and/or the sides of laser diode bar 12, the package 10 can be soldered to an adjacent package as described in further detail with regard to FIG. 3.

According to the yet another embodiment, the solder layers 16 are deposited or pre-deposited on the heat sinks 14, the exothermic layers 20 are deposited onto the solder layers 16, and the solder layers 18 are deposited onto the exothermic layers 20. The laser diode bar 12 is then positioned between the two solder layers 18. Alternatively, the solder layers 18 may be deposited or pre-deposited on the laser diode bar 12, the exothermic layers 20 deposited onto the solder layers 18, and the solder layers 16 deposited onto the exothermic layers 20. In that case, the heat sinks 14 are positioned adjacent the solder layers 16.

Figure 2:
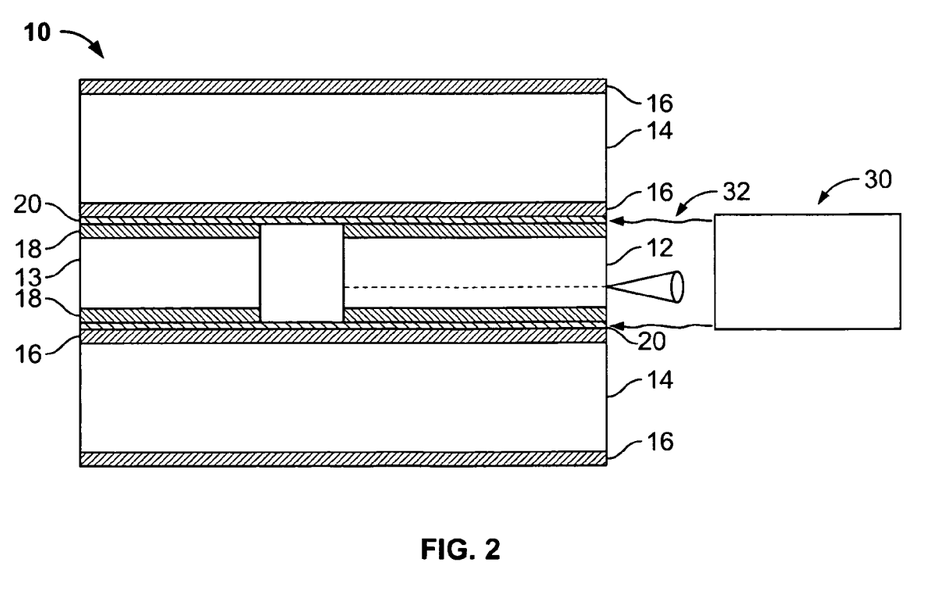
FIG. 2 illustrates a side view of a laser diode package prior to soldering with an energy source.

FIG. 2 illustrates a side view of an assembled laser diode package 10 prior to soldering the laser diode bar 12 to heat sinks 14. To complete the manufacture of the laser diode package 10, an energy source 30 supplies energy 32 to each exothermic layer 20. It is contemplated that the energy 32 may be supplied to each exothermic layer 20 one at a time or to multiple exothermic layers 20 simultaneously. The energy 32 is of sufficient magnitude to cause an exothermic reaction to propagate through the exothermic layers 20 (away from the energy source 30). Non-limiting examples of an energy source 30 and energy 32 suitable to cause an exothermic reaction in the exothermic layers 20 include a spark from a tesla coil or a laser such as, for example, a YAG laser. Laser-type energy sources may be preferred in some instances because energy supplied therefrom can be accurately focused on the exothermic layers 20. The exothermic layers 20 are made of a materials and thicknesses designed, taking into consideration the specific heat of solder, to provide sufficient heat to melt the solder layers 16 and the solder layers 18 during the exothermic reaction. Suitable methods of constructing the exothermic layers 20 are described, for example, in U.S. Pat. No. 5,538,795 entitled "Ignitable Heterogeneous Stratified Structure For The Propagation Of An Internal Exothermic Chemical Reaction Along An Expanding Wavefront And Method Of Making Same" which was filed on Jul. 15, 1994 and U.S. Pat. No. 5,381,944 entitled "Low Temperature Reactive Bonding" which was filed on Nov. 4, 1993, both of which are incorporated herein by reference in their entirety.

As a non-limiting example, the exothermic layers 20 may be made from multiple alternating layers of nickel and aluminum. Further, each layer of nickel and aluminum forming the exothermic layer 20 may be, for example, on the order of 100 nanometers thick. However, it is contemplated that the exothermic layer 20 may be of a thickness that is smaller, larger, or on the order of the solder layers 16 and the solder layers 18 which, for example, may be approximately 3-5 microns thick. It is further contemplated that in embodiments including a foil-type exothermic layer 20, the foil-type exothermic layer 20 may be as thick as 25 microns.

If the exothermic layers 20 are properly designed, the exothermic reaction will melt the solder layers 16 and the solder layers 18 but add little additional heat to either the laser diode bar 12 or the heat sinks 14. (i.e., the exothermic reaction causes insubstantial change in temperature at the surfaces of the laser diode bar 12 and the heat sink(s) 14). Thus, the problems associated with soldering CTE mismatched components is avoided because there is no substantial heating or cooling of the laser diode bar 12 or the heat sinks 14. However, even if the exothermic layer(s) are not perfectly designed from a thermal capacity perspective, CTE problems will still be minimized because less heat is transferred to the laser diode bar 12 and the heat sinks 14 than would otherwise be transferred according to conventional soldering methods. After the exothermic reaction is complete, the individual layers of material that previously formed the exothermic layers 20 may become a single layer alloy of those materials that are independent of or mixed with the solder layers.

If a spacer 13 is incorporated in the laser diode package 10, the spacer may be positioned sufficiently proximate to the laser diode bar 12 to allow only nominal, if any, heat to reach the laser diode bar 12 or the heat sinks 14 via the gap between the spacer 13 and laser diode bar 12.

Figure 3:
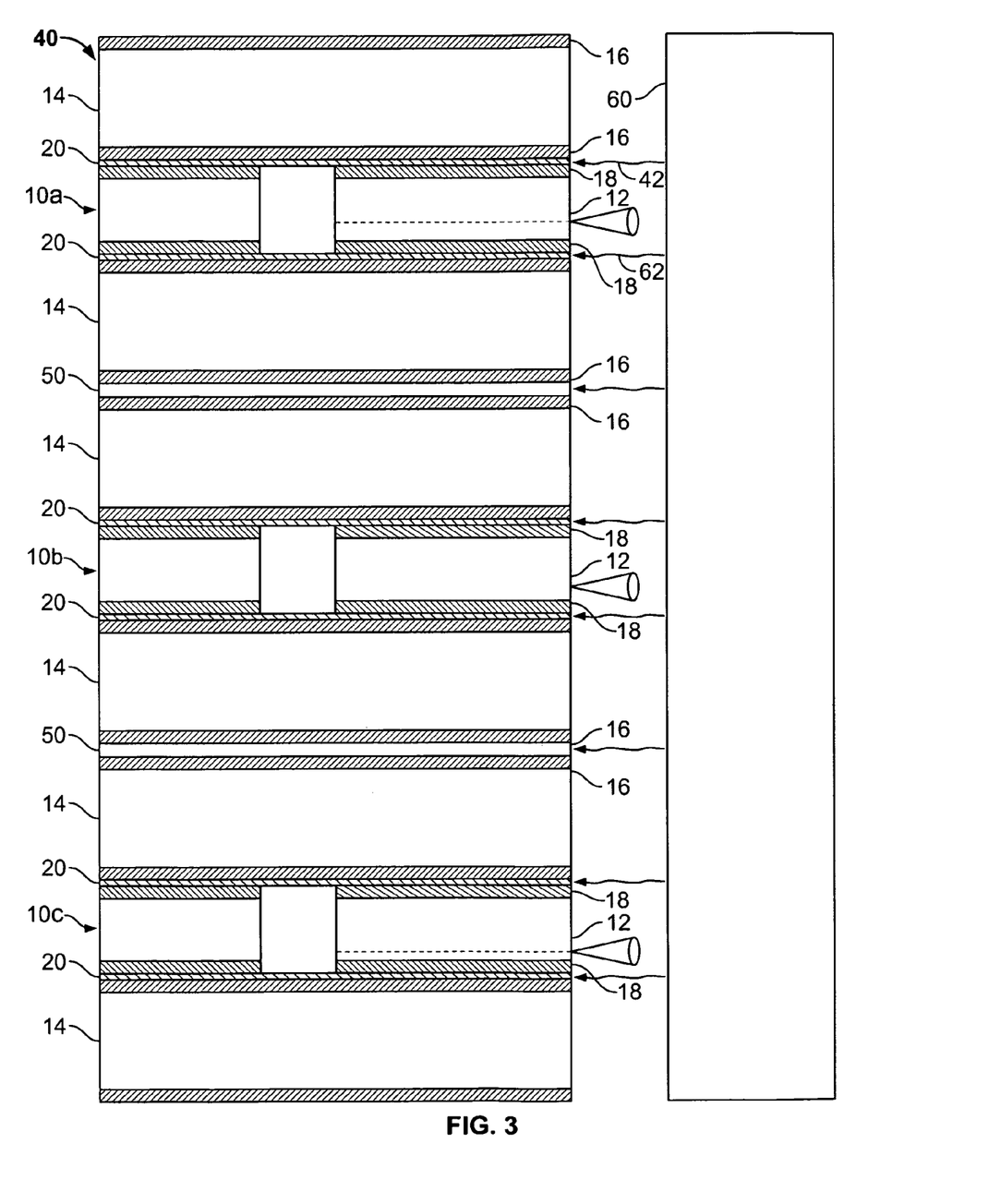
FIG. 3 illustrates a side view of three laser diode packages arranged in a laser diode array prior to soldering.

FIG. 3 illustrates a side view of a laser diode array 40 composed of three stacked laser diode packages 10a, 10b and 10c prior to soldering the packages to each other. It is contemplated that a laser diode array 40 may be comprised of any number of laser diode packages 10. An exothermic layer 50 is provided between each laser diode package 10a, 10b and 10c. To complete the manufacturing process of the laser diode array 40, an energy source 60 supplies energy 62 to each exothermic layer 50 causing an exothermic reaction to propagate through the exothermic layer 50. It is contemplated that the energy 62 may be supplied to each exothermic layer 50 one at a time or to multiple exothermic layers 50 simultaneously. It is further contemplated that the same energy source 60 can provide the exothermic reaction to the exothermic layers 20 within each package 10 in addition to the exothermic layers 50 between each package 10, and may do so simultaneously.

The exothermic layers 50 are made from a material and thickness designed to provide sufficient heat to melt the solder layers 16. If properly designed, the exothermic reaction will melt the solder layers 16, but add little additional heat to the heat sinks 14 and the laser diode bars 12. Thus, the problems associated with soldering CTE mismatched components is avoided because there is no substantial heating or cooling of the heat sinks 14 and/or the laser diode bars 12.

As shown in FIG. 3, each laser diode package 10a, 10b and 10c includes two heat sinks 14. However, it is contemplated that an array 40 may be formed from laser diode packages having only one heat sink per package. Such packages may be attached to adjacent packages by an exothermic reaction between the exterior solder layer on the laser diode bar of the first package and the exterior solder layer on the heat sink of the adjacent package. Alternatively, such packages may include a connector attached to the laser diode bar for attachment to adjacent packages. A non-limiting example of a laser diode package including a connector attached to the laser diode bar is described below with respect to the embodiments of FIGS. 5A and 5B.

Figure 4:
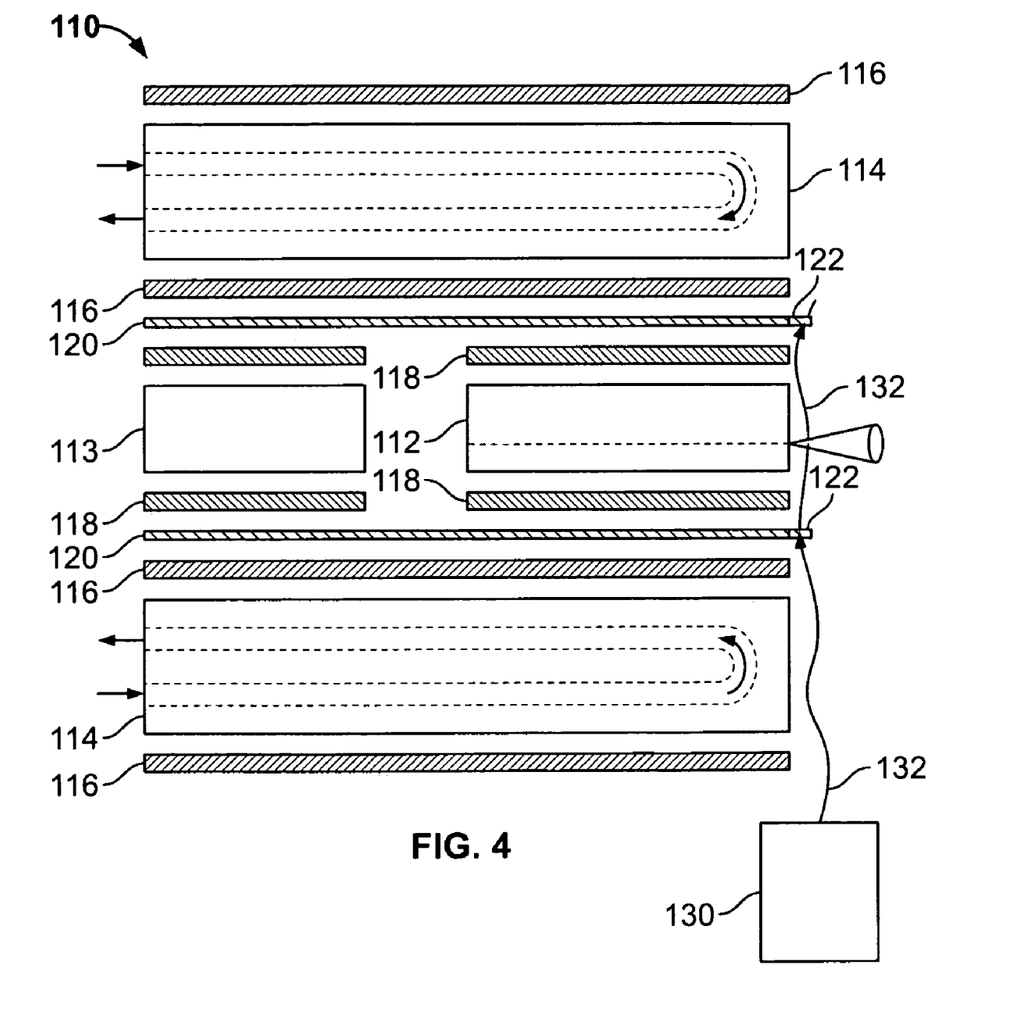
FIG. 4 illustrates an exploded side view of a laser diode package having internal fluid cooling in the heat sinks.

FIG. 4 illustrates an alternative embodiment of the laser diode package 10 previously described with respect to FIGS. 1A, 1B, and 2. According to this embodiment, a laser diode package 110 includes a laser diode bar 112 and at least one microchannel cooler 114. The microchannel cooler(s) 114 may be made from metal to allow thermal and electrical connection to the laser diode bar 112 by solder layers 116 and solder layers 118. The solder layers 116, the exothermic layers 120, and the solder layers 118 may be assembled on either the laser diode bar 112 and/or the microchannel cooler(s) 114 as previously described with respect to the solder layers 16, the exothermic layers 20, and the solder layers 18 of FIG. 1B. Likewise, the package manufacturing process is completed by supplying energy from an energy source to the exothermic layers 120 as previously described with respect to the exothermic layers 20 of FIG. 2. It is contemplated that a laser diode array of laser diode packages 110 may be manufactured as previously described with respect to FIG. 3.

In some embodiments, each exothermic layers 120 may have a fuse portion 122 extending beyond either edge surface of the laser diode bar 112 and the microchannel cooler(s) 114. When an energy source 130 supplies energy 132 to the fuse portions 122, an exothermic reaction is initiated in and propagates through the exothermic layers 120. If multiple exothermic layers 120 are provided in a package or an array, the fuse portions 122 may be offset from each other such that a single energy source 130 can supply energy 132 to each fuse portion 122 simultaneously. It is contemplated that a fuse portion similar to fuse portion 122 may also be provided in any of the other laser diode package and array embodiments described herein.

Figure 5A:
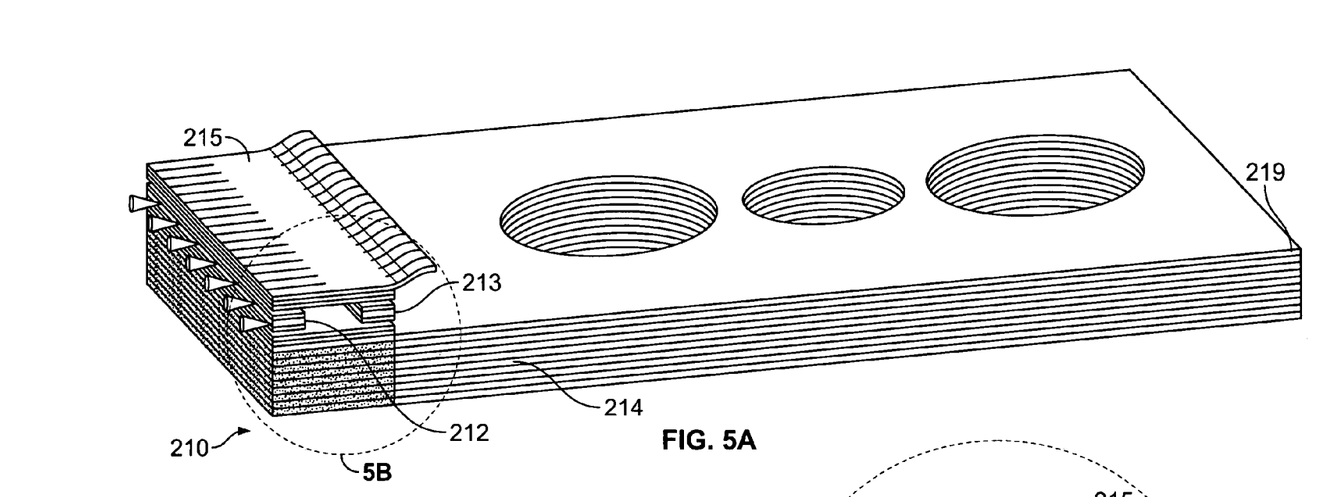
FIG. 5A illustrates a perspective view of a laser diode package according to yet another embodiment that includes internal cooling in the heat sink.
Figure 5B:
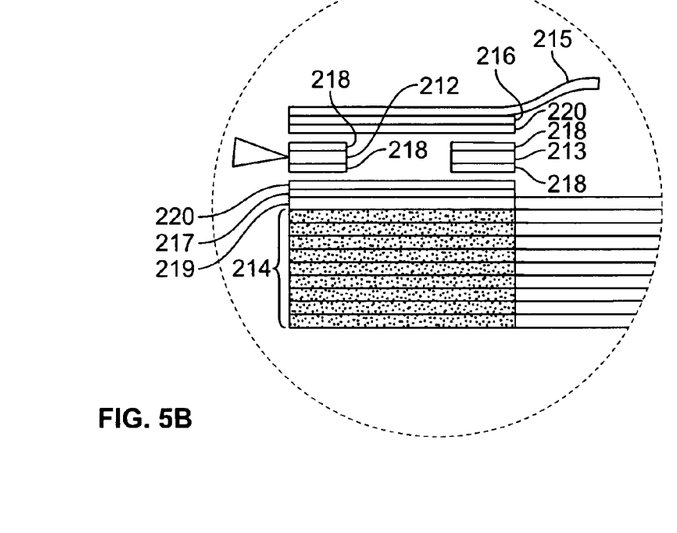
FIG. 5B illustrates an enlarged side view of a portion of the laser diode package illustrated in FIG. 5A.

FIGS. 5A and 5B illustrate an alternative embodiment of the laser diode package 110 previously described with respect to FIG. 4. This embodiment is directed to the manufacture of laser diode packages and arrays described in U.S. patent application Ser. No. 11/493,228 entitled "Microchannel Cooler For High Efficiency Laser Diode Heat Extraction" which was filed on Jul. 26, 2006, and is incorporated herein by reference in its entirety.

According to this embodiment, a laser diode package 210 includes a nonmetallic microchannel cooler 214, a laser diode bar 212, an insulator substrate 213, and a spring connector 215. The microchannel cooler 214 is comprised of a plurality of ceramic sheets fused together having a top ceramic sheet 219. A solder layer 216 is adjacent to the underside of the spring connector 215 and a solder layer 217 is adjacent to a metallized portion of the top sheet 219 of the microchannel cooler 214. Solder layers 218 are adjacent to a plurality of surfaces of the laser diode bar 212 and the insulator substrate 213. A first exothermic layer 220 is positioned between the solder layer 216 and the solder layers 218. A second exothermic layer 220 is positioned between the solder layer 217 and the solder layers 218. The solder layers 216, 217, and 218 and the exothermic layers 220 may be applied to adjacent components as previously described with respect to FIG. 1B. Likewise, the package manufacturing process may be completed by supplying energy from an energy source to the exothermic layers 220 as previously described with respect to the exothermic layers 20 of FIG. 2. Thus, FIGS. 5A and 5B illustrate the exothermic material being used to attach a connector 215 to a laser diode bar 212. The package 210 with the connector 215, laser diode bar 212, and microchannel cooler 214 can then be attached to another package 210 to create an array, as described in U.S. patent application Ser. No. 11/493,228.

While the present invention has been described with reference to one or more particular embodiments, those skilled in the art will recognize that many changes may be made thereto without departing from the spirit and scope of the present invention. Each of these embodiments and obvious variations thereof is contemplated as falling within the spirit and scope of the claimed invention, which is set forth in the following claims.

What is claimed is:

1. A method for manufacturing a laser diode package comprising a laser diode bar and a first heat-sinking structure, the method comprising:

depositing a quantity of solder material on a surface of said first heat-sinking structure to form a heat-sinking solder layer that is attached to said surface of said first heating-sinking structure, said quantity of solder material being deposited to create a thickness of less than 5 microns of said heat-sink solder layer;

depositing a quantity of exothermic material on said heat-sinking solder layer to form a first exothermic layer that is attached to said heat-sinking solder layer, said depositing of said exothermic material occurring as said exothermic material is in a heated vaporous form to create said first exothermic layer having a thickness less than said heat-sink solder layer;

depositing a second quantity of solder material on said first exothermic layer to form a bar solder layer that is attached to said first exothermic layer, said second quantity of solder material being deposited to create a thickness of less than 5 microns of said bar solder layer;

after said three previous acts of depositing, positioning said laser diode bar on said bar solder layer;

exposing said first exothermic layer to a known energy source to cause liquidification of at least a portion of said heat-sinking solder layer and said bar solder layer; and after said exposing, allowing said heat-sinking solder layer and said bar solder layer to solidify to join said first heat-sinking structure to said laser diode bar.

2. The method of claim 1, wherein said laser diode package further comprises a second heat-sinking structure, the method further comprising:

depositing a quantity of solder material on a surface of said second heat-sinking structure to form a second heat-sinking solder layer that is attached to said surface of said second heat-sinking structure, said quantity of solder material being deposited to create a thickness of less than 5 microns on said second heat-sinking solder layer;

depositing a quantity of exothermic material on said second heat-sinking solder layer to form a second exothermic layer that is attached to said second heat-sinking solder layer, said depositing of said second exothermic material being in a heated vaporous form to create said second exothermic layer having a thickness less than said second heat-sinking solder layer; and depositing a quantity of solder material on said second exothermic layer to form a second bar solder layer that is attached to said second exothermic layer, said quantity of solder material being deposited to create a thickness of less than 5 microns of said second bar solder layer;

after said three previous acts of depositing on said second heat sinking structure, positioning said laser diode bar on said second bar solder layer;

exposing said second exothermic layer to a known energy source to cause liquidification of at least a portion of said second heat-sinking solder layer and said second bar solder layer; and after said exposing, allowing said second heat-sinking solder layer and said second bar solder layer to solidify to join said second heat-sinking structure to said laser diode bar.

3. The method of claim 2, wherein said first exothermic layer and said second exothermic layer are simultaneously exposed to said known energy source.

4. The method of claim 1, wherein said first heat-sinking structure is a microchannel cooler.

5. The method of claim 1, wherein said depositing said exothermic material to form said first exothermic layer includes sputtering exothermic material onto said heat-sinking solder layer.

6. The method of claim 1, wherein said depositing said exothermic material to form said first exothermic layer includes e-beam evaporation of exothermic material onto said heat-sinking solder layer.

7. The method of claim 1, wherein the amount of exothermic material is chosen such that a minimal amount of energy is received by said laser diode bar.

8. A method for manufacturing an array of laser diode packages, each of said laser diode packages comprising a laser diode bar and at least one heat-sinking structure, the method comprising:

depositing a quantity of solder material on first surfaces of said laser diode packages to attach a first solder layer on each of said first surfaces of said laser diode packages;

depositing a quantity of exothermic material on each of said first solder layers to attach an exothermic layer on each of said first solder layers, said depositing of said exothermic material occurring as said exothermic material is in a heated vaporous form, each of said exothermic layers including a fuse portion made from said exothermic material, each of said fuse portions extending beyond an end surface of said laser diode bar within said laser diode package;

depositing a quantity of solder material on each of said exothermic layers to attach a second solder layer on each of said exothermic layers;

after said three previous acts of depositing, positioning each of said laser diode packages such that said second solder layer of each laser diode package is against an attachment surface of an adjacent one of said laser diode packages; and exposing each of said fuse portions to a known energy source causing said first and second solder layers to join said adjacent ones of said laser diode packages.

9. The method of claim 8, wherein said at least one heat-sinking structure includes first and second heat-sinking structures, said laser diode bar being positioned between said first and second heat-sinking structures, said first solder layer, said exothermic layer, and said second exterior layer being on said first heat-sinking structure.

10. The method of claim 9, wherein said exothermic layers on each package in said away are simultaneously exposed to said known energy source.

11. The method of claim 8, wherein said at least one heat-sinking structure is a microchannel cooler.

12. The method of claim 8, wherein each of said laser diode packages includes a bar-heat-sink exothermic layer for attaching said laser diode bar to said at least one heat-sinking structure, and the method further includes exposing said bar-heat-sink exothermic layer to an energy source to cause interior solder layers between said at least one heat-sinking structure and said laser diode bar to attach said at least one heat-sinking structure and said laser diode bar.

13. The method of claim 12, wherein said exposing each of said fuse portions of said exothermic layers between packages to said known energy source and said exposing said bar-heat-sink exothermic layer to said energy source occur simultaneously.

14. The method of claim 8, wherein each of said laser diode packages includes said laser diode bar and one heat-sinking structure, said attachment surface being a surface on said laser diode bar.

15. The method of claim 8, wherein said depositing of said exothermic material includes e-beam evaporation.

16. The method of claim 8, wherein said fuse portions of said laser diode packages are spaced away from said fuse portions of adjacent laser diode packages.

17. The method of claim 16, wherein said known energy source is a single energy source and said fuse portions on each package in said away are substantially simultaneously exposed to said known energy source.

18. The method of claim 1, wherein said first exothermic layer includes a fuse portion made from said exothermic material, said fuse portion extends beyond an end surface of said laser diode bar such that only said fuse portion is exposed to said known energy source.

19. The method of claim 18, wherein said fuse portion extends beyond said end surface of said laser diode at which energy is emitted.

20. A method for manufacturing a laser diode package comprising a laser diode bar and a first heat-sinking structure, the method comprising:

depositing a quantity of solder material on a surface of said first heat-sinking structure to form a heat-sinking solder layer that is attached to said surface of said first heating-sinking structure;

depositing a quantity of exothermic material on said heat-sinking solder layer to form a first exothermic layer that is attached to said heat-sinking solder layer, said depositing of said exothermic material occurring while said exothermic material is in a heated vaporous form, said first exothermic layer including a fuse portion;

depositing a second quantity of solder material on said first exothermic layer to form a bar solder layer that is attached to said first exothermic layer;

after said three previous acts of depositing, positioning said laser diode bar on said bar solder layer, said fuse portion of said first exothermic layer being exposed beyond an end surface of said laser diode bar after said positioning;

exposing said fuse portion of said first exothermic layer to a known energy source to cause liquidification of at least a portion of said heat-sinking solder layer and said bar solder layer; and after said exposing, allowing said heat-sinking solder layer and said bar solder layer to solidify to join said first heat-sinking structure to said laser diode bar.

\* \* \* \* \*

UNITED STATES PATENT AND TRADEMARK OFFICE
CERTIFICATE OF CORRECTION

PATENT NO. : 7,724,791 B2  Page 1 of 1
APPLICATION NO. : 12/009458
DATED : May 25, 2010
INVENTOR(S) : Edward F. Stephens, IV

It is certified that error appears in the above-identified patent and that said Letters Patent is hereby corrected as shown below:

Claim 10, Column 8, Line 51: "on each package in said away are simultaneously exposed to" change to "on each package in said array are simultaneously exposed to"

Claim 17, Column 9, Line 13: "package in said away are substantially simultaneously" change to "package in said array are substantially simultaneously"

Signed and Sealed this

Third Day of August, 2010

David J. Kappos
*Director of the United States Patent and Trademark Office*